United States Patent
Zhang et al.

(10) Patent No.: US 11,791,835 B1
(45) Date of Patent: Oct. 17, 2023

(54) COMPRESSION IMPROVEMENT IN DATA REPLICATION

(71) Applicant: International Business Machines Corporation, Armonk, NY (US)

(72) Inventors: Xiao Wei Zhang, Beijing (CN); Hao Zhang, Beijing (CN); Meng Guo, Beijing (CN); Liang Lu, Beijing (CN); Jing F Fan, Beijing (CN); Jing Huang, Beijing (CN); Deng Ke Zhao, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 17/806,617

(22) Filed: Jun. 13, 2022

(51) Int. Cl.
*H03M 7/30* (2006.01)

(52) U.S. Cl.
CPC ....... *H03M 7/3062* (2013.01); *H03M 7/3064* (2013.01); *H03M 7/6011* (2013.01)

(58) Field of Classification Search
CPC .... H03M 7/30; H03M 7/3062; H03M 7/3064; H03M 7/6011
See application file for complete search history.

(56) References Cited

U.S. PATENT DOCUMENTS

| | | | | |
|---|---|---|---|---|
| 5,243,341 A * | 9/1993 | Seroussi | ............... | G06T 9/005 341/51 |
| 8,295,615 B2 | 10/2012 | Celi, Jr. | | |
| 9,762,907 B2 * | 9/2017 | Fallon | ............... | H03M 7/30 |
| 9,792,128 B2 * | 10/2017 | Fallon | ............... | G06F 3/0638 |
| 10,146,787 B2 | 12/2018 | Bashyam | | |
| 10,187,081 B1 * | 1/2019 | Diamant | ............. | H03M 7/3088 |
| 10,652,358 B2 * | 5/2020 | Shribman | ............. | H04L 67/567 |
| 10,891,291 B2 * | 1/2021 | Li | ......... | G06F 16/256 |
| 11,675,761 B2 * | 6/2023 | Macnicol | ............ | G06F 16/2471 707/713 |

(Continued)

FOREIGN PATENT DOCUMENTS

CN    106844090 B    6/2021

OTHER PUBLICATIONS

Authors et al.: Disclosed Anonymously, "Method and system to reduce remote copy data transfer by reusing volume level compression", An IP.com Prior Art Database Technical Disclosure, IP.com No. IPCOM000250736D, IP.com Electronic Publication Date: Aug. 29, 2017, 6 Pages.

(Continued)

*Primary Examiner* — Lam T Mai
(74) *Attorney, Agent, or Firm* — Stephanie L. Carusillo

(57) ABSTRACT

The present invention provides a computer-implemented method, computer system and computer program product for data compression. According to the computer-implemented method, one or more data blocks on a data source to be replicated to a data target may be detected. Then, compression performance of a first compression dictionary may be evaluated. The first compression dictionary may be previously used to compress existing data on the data target. If the compression performance is lower than a preset performance threshold, a second compression dictionary may be generated based on the existing data on the data target. The data target may be updated based on the existing data and the one or more data blocks using the second compression dictionary.

20 Claims, 5 Drawing Sheets

(56) References Cited

U.S. PATENT DOCUMENTS

| | | | |
|---|---|---|---|
| 2008/0103773 A1* | 5/2008 | Kirshenbaum | G06F 40/30 704/252 |
| 2009/0198716 A1 | 8/2009 | Howarth | |
| 2012/0089579 A1* | 4/2012 | Ranade | G06F 16/183 707/693 |
| 2012/0089775 A1* | 4/2012 | Ranade | G06F 16/183 711/170 |
| 2018/0052953 A1* | 2/2018 | Ganeshalingam | G16B 30/00 |
| 2019/0034333 A1* | 1/2019 | Sazegari | G06F 12/08 |
| 2019/0379393 A1* | 12/2019 | Wu | H03M 7/42 |
| 2020/0184278 A1* | 6/2020 | Zadeh | G06N 3/044 |
| 2021/0092174 A1* | 3/2021 | Lin | H04N 1/64 |
| 2022/0036177 A1* | 2/2022 | Sriharsha | G06N 3/10 |
| 2022/0414630 A1* | 12/2022 | Yebes Torres | G06V 30/42 |
| 2023/0005286 A1* | 1/2023 | Yebes Torres | G06V 30/414 |

OTHER PUBLICATIONS

IBM, "Multiple compression dictionaries for replication source tables", IBM, Accessed Dec. 14, 2021, 2 Pages.

Mell et al., "The NIST Definition of Cloud Computing", Recommendations of the National Institute of Standards and Technology, NIST Special Publication 800-145, Sep. 2011, 7 pages.

* cited by examiner

COMPRESSION IMPROVEMENT IN DATA REPLICATION

BACKGROUND

The present invention relates to data processing and storage technologies, and more specifically, to methods, systems, and computer program products for data compression.

Nowadays, data processing and storage technologies are widely applied. In many cases, data may be required to be replicated from a data source to a data target. During the data replication, data may be compressed to save storage spaces and costs. Different types of compression dictionaries may be applied by multiple data compression algorithms in the data compression. The quality of a compression dictionary is very important to the performance of data compression.

SUMMARY

According to one embodiment of the present invention, there is provided a computer-implemented method. According to the computer-implemented method, one or more data blocks on a data source to be replicated to a data target may be detected. Then, compression performance of a first compression dictionary may be evaluated. The first compression dictionary may be previously used to compress existing data on the data target. If the compression performance is lower than a preset performance threshold, a second compression dictionary may be generated based on the existing data on the data target. The data target may be updated based on the existing data and the one or more data blocks using the second compression dictionary.

According to another embodiment of the present invention, there is provided a computer system. The computer system comprises one or more processors, a computer-readable memory coupled to the one or more processors. The computer-readable memory comprises instructions that when executed by the one or more processors perform actions of the above-mentioned computer-implemented method.

According to another embodiment of the present invention, there is provided a computer program product. The computer program product comprises a computer readable storage medium having program instructions embodied therewith, the program instructions executable by a processor to cause the processor to perform actions of the above-mentioned computer-implemented method.

According to embodiments of the present invention, higher compression performance can be achieved with a small overhead, while reducing latency of data synchronization between the data source and the data target and improving query performance of the data target.

BRIEF DESCRIPTION OF THE SEVERAL VIEWS OF THE DRAWINGS

Through the more detailed description of some embodiments of the present invention in the accompanying drawings, the above and other objects, features and advantages of the present invention will become more apparent, wherein the same reference generally refers to the same components in the embodiments of the present invention.

DETAILED DESCRIPTION

Figure 1:
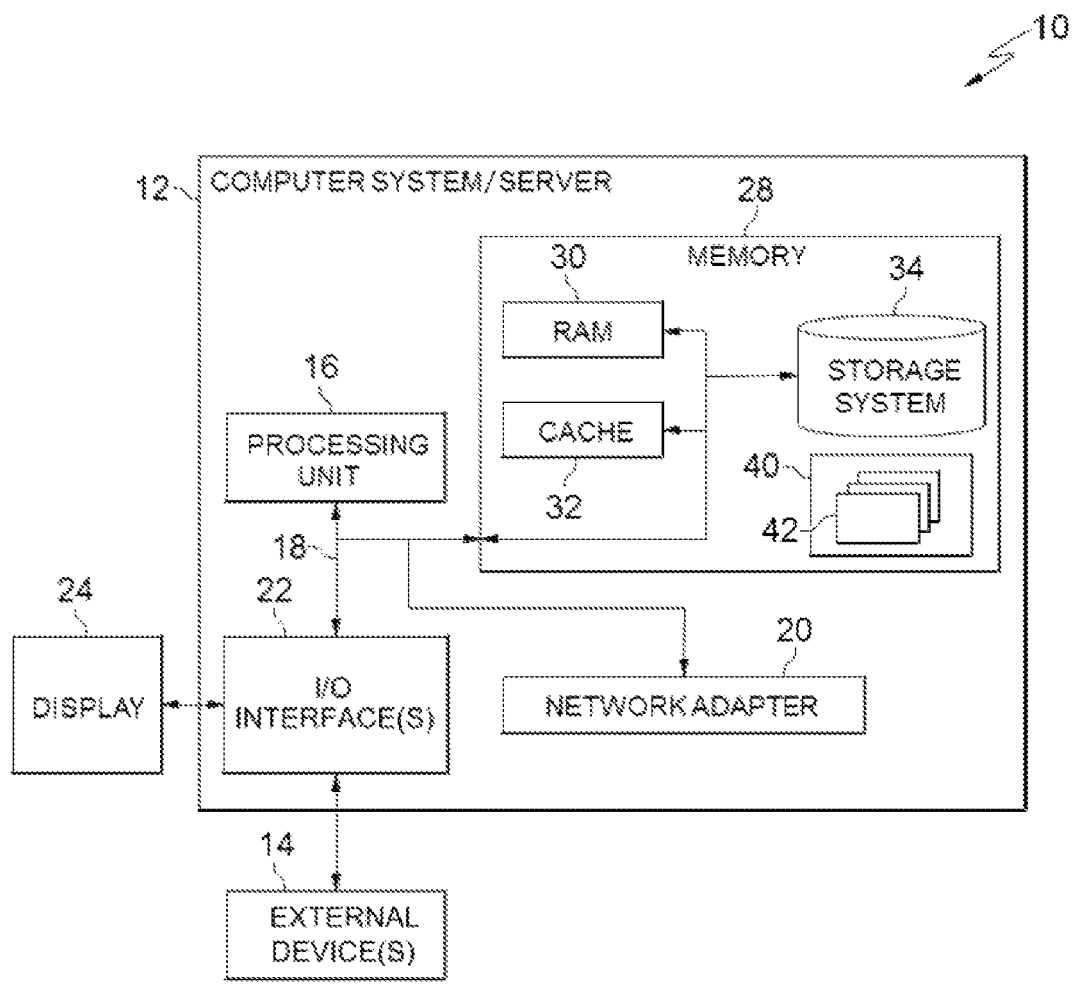
FIG. 1 depicts a cloud computing node according to an embodiment of the present invention.

Some embodiments will be described in more detail with reference to the accompanying drawings, in which the embodiments of the present invention have been illustrated. However, the present invention can be implemented in various manners, and thus should not be construed to be limited to the embodiments disclosed herein.

It is to be understood that although this invention includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12 or a portable electronic device such as a communication device, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
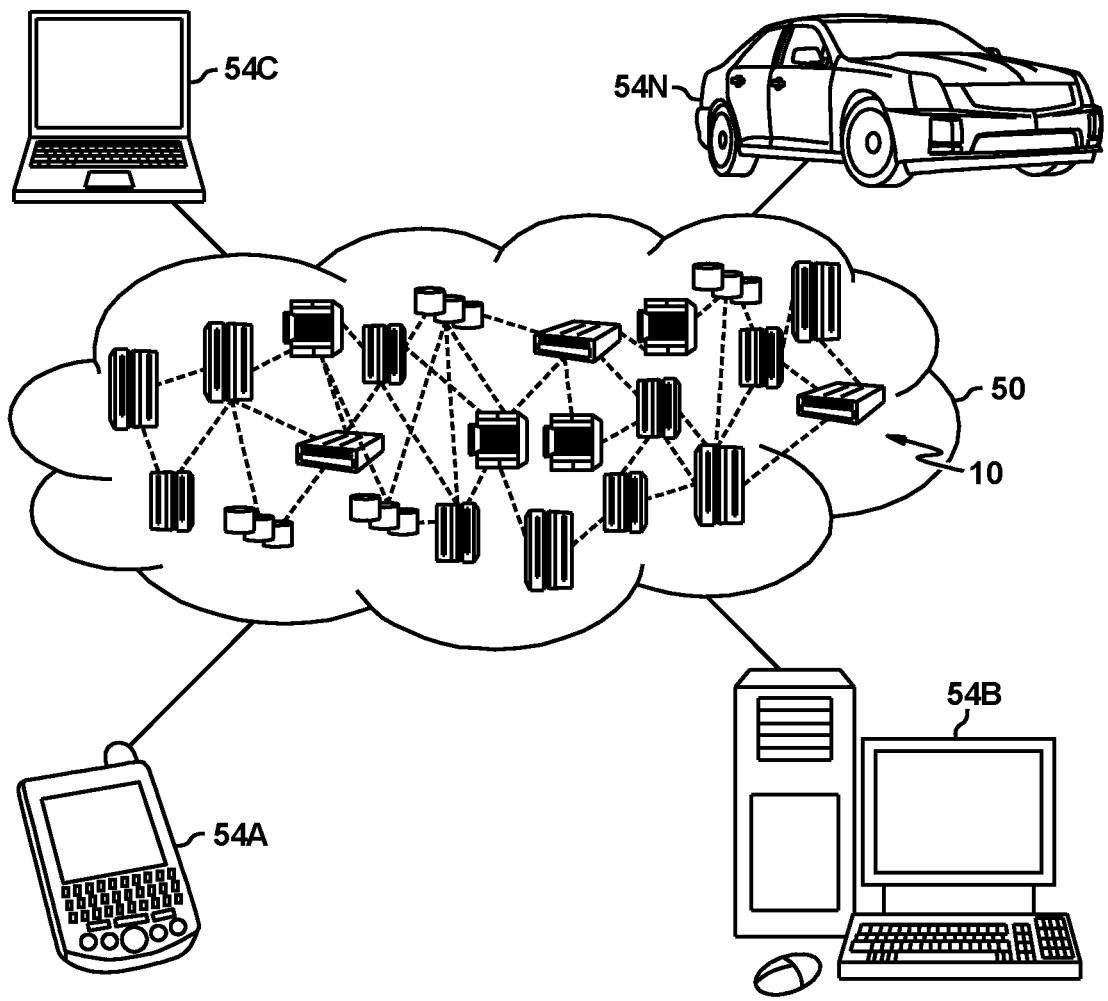
FIG. 2 depicts a cloud computing environment according to an embodiment of the present invention.

Referring now to FIG. 2, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
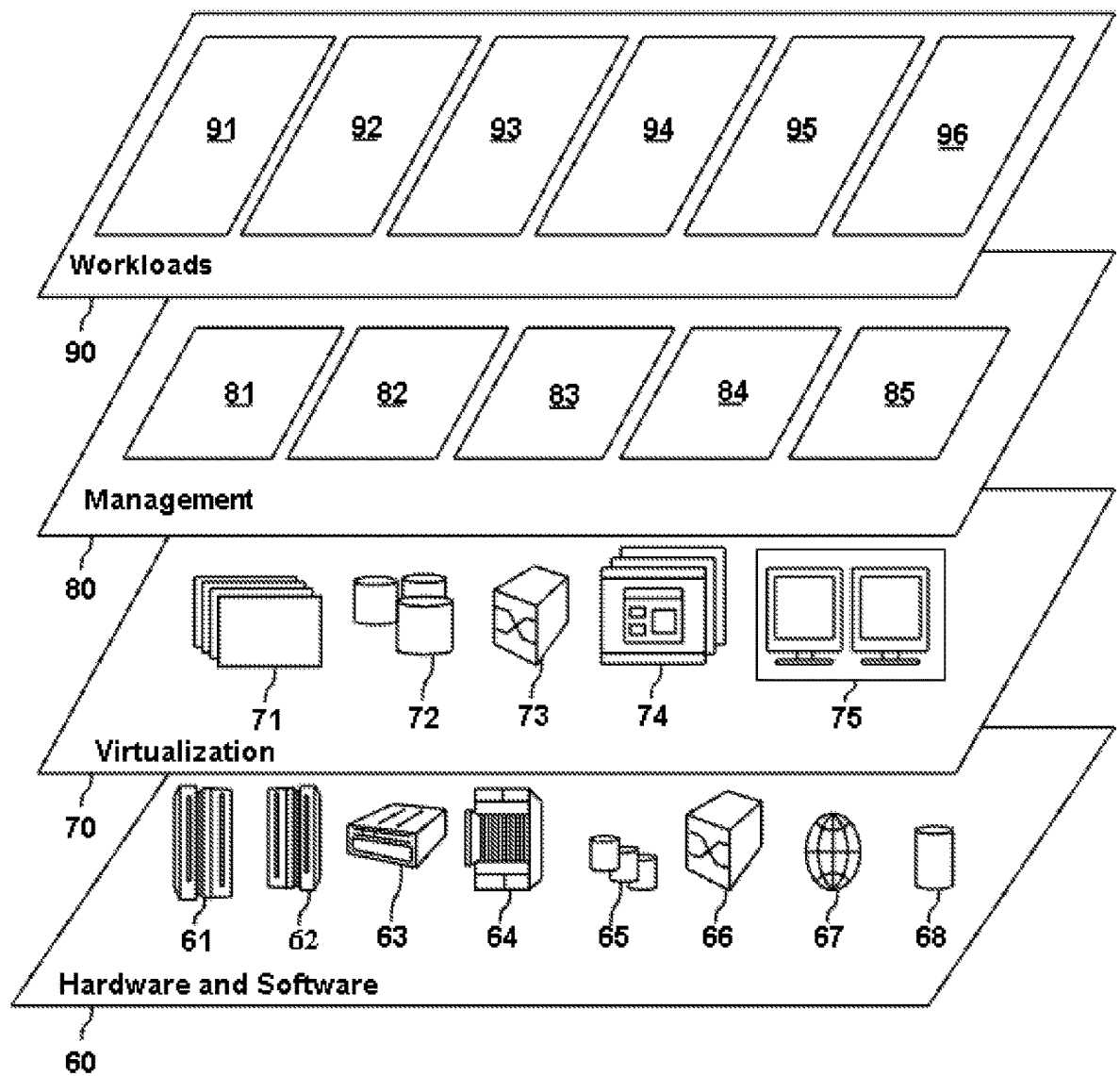
FIG. 3 depicts abstraction model layers according to an embodiment of the present invention.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and data compression 96.

In data replication scenarios, "load" and "reload" are operations that may be implemented in multiple types of databases. The load operation may be applied to replicate (i.e., "synchronize") data of a source table to a target table. The reload operation, which may be required by activities (such as, non-logging activities, etc.) generating data updates on the source table, may be applied to replicate (synchronize) the data updates from the source table to the target table. The reload operation may generate a new version of the target table that may replace an old version of the target table. In some examples, data in the new version of the target table and the old version of the target table may be similar.

Figure 4:
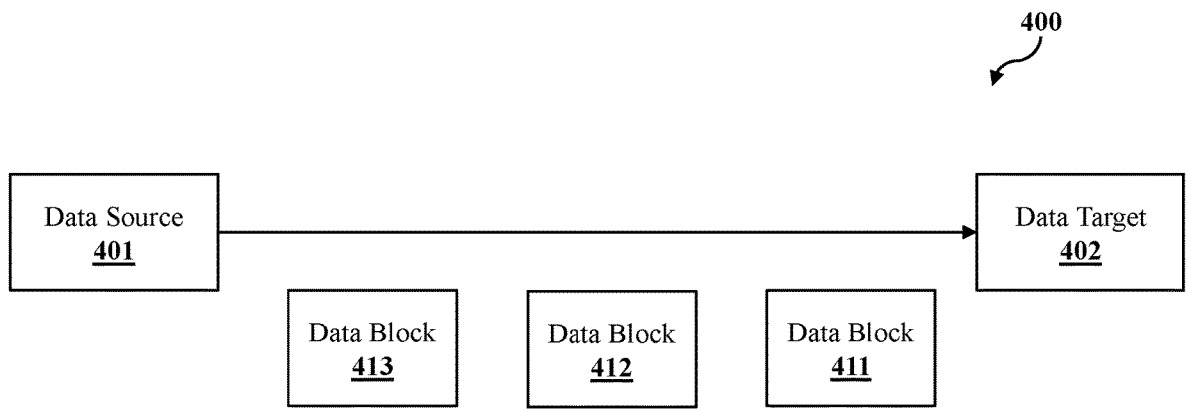
FIG. 4 depicts a schematic diagram of a data replication processing accord to an embodiment of the present invention.

Referencing now to FIG. 4, a schematic diagram of a data replication process 400 according to an embodiment of the present invention is depicted. During the data replication process 400, data blocks (such as, data blocks 411, 412, and 413 shown in FIG. 4) may be replicated (synchronized) from a data source 401 to a data target 402. In some examples, the data source 401 may be a source table storing original data hosted in a first device, and the data target 402 can be a target table, which can be hosted in the first device or another device with one or more data connections to the first device and stores the data replicated from the original data of the data source 401. In some examples, the data source 401 and the data target 402 may be any type of databases, data pools, or data storage structures currently known or to be developed, which can be used to store data. As an example, the data replication process 400 can be a "load" operation mentioned above. The data blocks 411, 412, and 413 may comprise any lengths of data. As an example, the data block 411 may comprise a first character string "1ABC2DEF3HIJ", the data block 412, may comprise a second character string "4ABC5DEF6HIJ", and the data block 413 may comprise a third character string "7ABC8DEF9HIJ".

During the data replication process 400, a first compression dictionary may be built based on only initial parts of the data (such as, the data block 411) received at the data target 402, and the data blocks 411, 412, and 413 may be compressed using the compression dictionary. The compressed data corresponding to the data blocks 411, 412, and 413 may then be stored to the data target 402. Due to the limitation to the size of sampled data for building the compression dictionary, compression performance of the first compression dictionary may be limited.

Embodiments of the present invention provide a computer-implemented method to compress data during data replication. In some embodiments, the computer-implemented method can be implemented by a computer device hosting the data target 402 or with the capability to access the data target 402.

Figure 5:
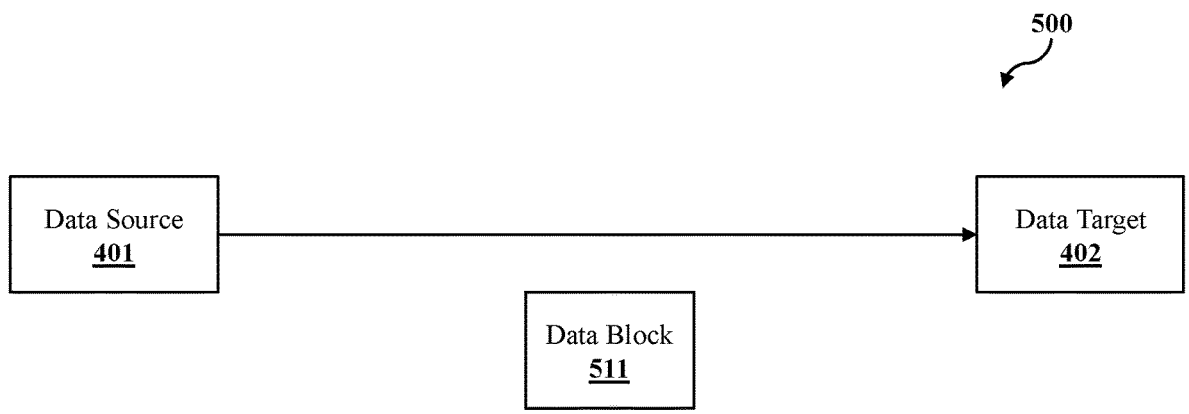
FIG. 5 depicts a schematic diagram of a further data replication process according to an embodiment of the present invention.

Referencing now to FIG. 5, a schematic diagram of a further data replication process 500 according to an embodiment of the present invention is depicted. According to embodiments of the present invention, during the further data replication process 500, one or more data blocks on the data source 401 to be replicated (synchronized) to the data target 402 can be detected by the computer device.

In some embodiments, the computer device may receive a data replication request or instruction from the data source 401 or another computer device hosting the data source 401 and detect the one or more data blocks to be replicated based on the data replication request or instruction. In some embodiments, non-logging activities may happen on the data source 401, and one or more data blocks (such as, a data block 511) may be generated by the non-logging activities on the data source 401. The one or more data blocks may be data updates to original data (such as, the data blocks 411, 412, and 413) on data source 401 before the non-logging activities. The one or more data blocks may comprise data incremental to the original data on the data source 401 or data replacing parts of or all the original data on the data source 401.

In some embodiments, the further data replication process 500 may be a "reload" operation, which may be used to replicate (synchronize) the one or more data blocks from the data source 401 to the data target 402. In this example, during the "reload" operation, the computer device may detect the one or more data blocks on the data source 401 to be replicated to data target 402. As an example, the data block 511 generated on the data source 401 may comprise a fourth character string "XABCYDEFZHIJ". The "reload" operation may be applied to replicate the fourth character string from the data source 401 to the data target 402. If the computer device receives the "reload" operation instruction, the computer device may detect the one or more data blocks based on the "reload" operation instruction.

According to embodiments of the present invention, after detecting the one or more data blocks to be replicated, the compression performance based on the first compression dictionary on the data target 402 may be evaluated. The first compression dictionary may be a compression dictionary previously used to compress existing data on the data target. The existing data on the data target may include data received from the data source before the further data replication process 500 and compressed using the first compression dictionary, such as, the data blocks 411, 412, and 413 received in the data replication process 400. The compression performance may be represented as a compression ratio, a compression time consumption, or any other types of compression performance parameters.

In some embodiments, the compression performance based on the first compression dictionary may be represented as a first compression ratio, and the first compression ratio may be calculated as the size of compressed data divided by the size of corresponding original data. For example, if the size of the original data is 1000 bytes and the size of the compressed data using the first compression dictionary is 900 bytes, the first compression ratio may be calculated as 90%. It shall be noted that other manners for calculating the compression ratio may also be applied. In some other embodiments, the compression performance based on the first compression dictionary may be represented as a second compression ratio, which may be calculated as the size of the saved space divided by the size of the corresponding original data. For example, if the size of the original data is 1000 bytes and the size of the saved space using the first compression dictionary is 100 bytes (which means the size of the compressed data is 900 bytes), the second compression ratio may be calculated as 10%.

According to embodiments of the present invention, if the evaluated compression performance does not reach a desired performance threshold, a second compression dictionary may be generated based on existing data on the data target 402. For example, if the evaluated compression performance is represented as the first compression ratio calculated as the size of the compressed data divided by the size of the corresponding original data, and the first compression ratio is larger than a preset threshold (such as, 80%), the compression performance is evaluated as not reaching the desired performance threshold. In another example, if the evaluated compression performance is represented as the second compression ratio calculated as the size of the saved space divided by the size of the corresponding original data, and the first compression ratio is lower than a preset threshold (such as, 10%), the compression performance is evaluated as not reaching the desired performance threshold. In a further example, if the evaluated compression performance is represented as the compression time consumption, with the compression time consumption being larger than a preset threshold (such as, 0.1 seconds), the compression performance is evaluated as not reaching the desired performance threshold.

In some embodiments, compressed data stored on the data target 402 may be decompressed using the first compression dictionary to obtain the existing data (e.g., data blocks 411, 412, and 413). Herein, the compressed data stored on the data target 402 may include compressed data generated using the first compression dictionary and stored on the data target 402 before the implementation of the computer-implemented method, such as, during the data replication process 400. The second compression dictionary may be generated based on the existing data. In some embodiments, parts of the existing data on the data target 402 (such as, the data blocks 411 and 412) other than only the initial parts (such as, the data blocks 411 selected to generate the first compression dictionary) may be selected as sample data for generating the second compression dictionary. In some embodiments, all the existing data on the data target 402 (such as, all the data blocks 411, 412, and 413) may be selected as the sample data. As the size of the sample data is larger than the size of data previously selected for generating the first compression dictionary, performance of the second compression dictionary would be better than that of the first compression dictionary.

In some embodiments, one or more common data patterns of the sample data on the data target 402 may be obtained by analyzing the sample data, and the second compression dictionary may be generated based on the one or more common data patterns. For example, for the sample data including the data blocks 411, 412, and 413, character groups "ABC", "DEF", and "HIJ" exist frequently and may be marked as common data patterns. These character groups can be coded using shorter characters in the second compression dictionary, and then the shorter characters can be used to compress data with the common data patterns.

According to embodiments of the present invention, the data target 402 may be updated based on the existing data received before the further data replication process 500 and the one or more data blocks received during the further data replication process 500 using the second compression dictionary. As a specific example, an insert operation may be implemented on the data target 402 to update the data target 402 based on the existing data and the one or more data blocks.

In some embodiments, the one or more data blocks may be received from the data source. The step of updating the data target 402 may comprise the following sub-steps: a data group integrating the existing data and the one or more data blocks may be determined and then compressed using the second compression dictionary to obtain a compressed data group, and the data target 402 may be updated with the compressed data group. In some embodiments, during the process of updating the data target 402, compressed data corresponding to the existing data, which was previously stored on the data target 402, may be removed from the data target 402.

As an example, the one or more data blocks may include the data block 511. During the further data replication process, the data block 511 may be received at the data target 402 from the data source 401. The existing data on the data target 402 (such as, the data blocks 411, 412, and 413) and the received data block 511 may be integrated to obtain a data group.

In some embodiments, the one or more data blocks may include data incremental to the existing data on the data target 402, and the integrated data group may include both the existing data (such as, all the data blocks 411-413) and the one or more data blocks (such as, the data block 511).

In some other embodiments, the one or more data blocks may include data replacing expired parts of the existing data on the data source 401, and the data group may include the one or more data blocks and remaining parts of the existing data after removing the expired parts. For example, the one or more data blocks may be the data block 511 for replacing the data block 411 previously received on the data target 402, and the integrated data group may include the data block 511, the data block 412, and the data block 413.

In some embodiments, if the evaluated compression performance reaches a desired performance threshold, the data target 402 may be updated based on the one or more data blocks using the first compression dictionary. In this situation, the second compression dictionary may not be generated. As an example, the first compression dictionary may continually be applied to compress the one or more data blocks (such as, the data block 511) received during the further data replication process 500 to obtain further compressed data, and the data target 402 may be updated with the further compressed data. The further compressed data may be incremented to the compressed data previously stored on the data target 402 or may replace expired parts of the compressed data previously stored on the data target 402.

According to embodiments of the present invention, during the further data replication process 500, a data change ratio of the one or more data blocks may be calculated. In some embodiments, the data change ratio may be the size of the one or more data blocks divided by the size of the existing data on the data target 402. Only if the calculated data change ratio is larger than a preset change threshold, some above-mentioned steps (such as, evaluating the compression performance, generating the second compression dictionary, updating the data target 402 based on the existing data and the one or more data blocks using the second compression dictionary, etc.) may be implemented. If the calculated data change ratio is not larger than the preset change threshold, the above-mentioned steps may not be implemented. In the latter situation, the second compression dictionary may not be generated, and the data target 402 may be updated based on the one or more data blocks using the first compression dictionary. As an example, the one or more data blocks (such as, the data block 511) received at the data target 402 may be compressed using the first compression dictionary to obtain further compressed data, and the data target 402 may then be updated with the compressed data blocks. The further compressed data may be incremented to the compressed data previously stored on the data target 402 or may replace expired parts of the compressed data previously stored on the data target 402. As a specific example, the preset change threshold may be 50%. If the calculated data change ratio is smaller than 50%, which means less than 50% of the existing data on the data target will be updated, the second compression dictionary may not be generated, and the first compression dictionary may continually be used to compress the one or more data blocks. The preset change threshold can be set as any needed value based on a balance among compression performance, overheads, costs, etc.

According to embodiments of the present invention, as the second compression dictionary can be generated based on the existing data on the data target during a further replication process (such as, during a reload operation on the data target), higher compression performance can be achieved with a small overhead. As a result, latency during the data synchronization between the data source and the data target may be reduced, and query performance of the data target may also be improved.

Figure 6:
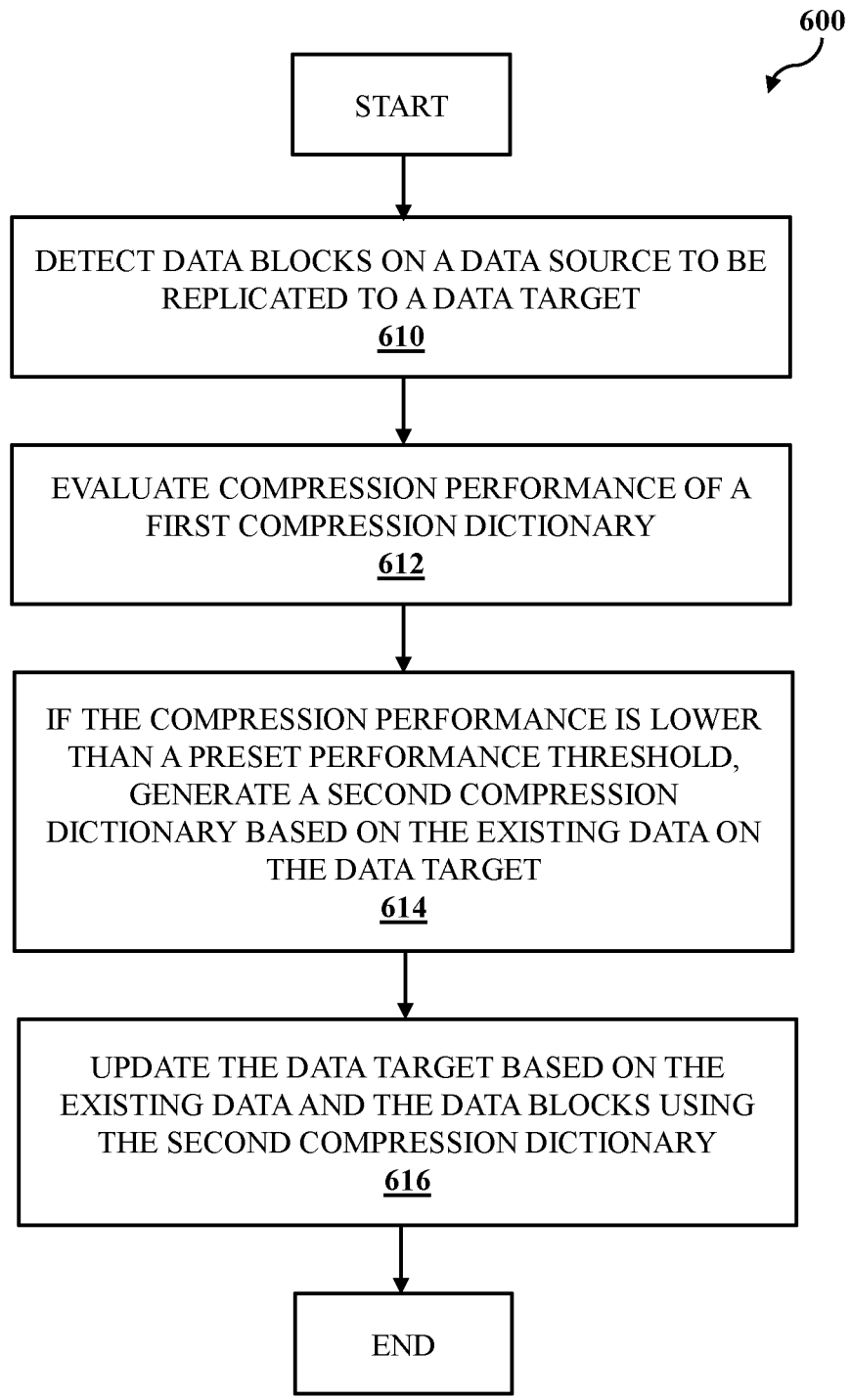
FIG. 6 depicts a flow chart of an example method for data compression according to an embodiment of the present invention.

Referring now to FIG. 6, a schematic flowchart of a method 600 for data compression according to an embodiment of the present invention is depicted. The method 600 can be implemented by the computer system/server 12 of FIG. 1, or a device in a network environment. In some embodiments, the method 600 can be implemented by a computer device hosting or with the capability to access the data target 402 of the FIG. 4. It should be noted that the method 600 is only illustrative and is not intended to suggest any limitation to the scope the present invention.

At block 610, a computer device implementing the method 600 may detect one or more data blocks on a data source to be replicated to a data target. As an example, the data source may be the data source 401 of FIG. 4, and the data target may be the data target 402 of FIG. 4.

At block 612, the computer device may evaluate compression performance of a first compression dictionary. The first compression dictionary may be a compression dictionary previously used to compress existing data on the data target. The existing data on the data target may include data received from the data source and compressed using the first compression dictionary before the implementation of the method 600.

At block 614, if the compression performance is lower than a preset performance threshold, the computer device may generate a second compression dictionary based on the existing data on the data target.

At block 616, the computer device may update the data target based on the existing data and the one or more data blocks using the second compression dictionary.

According to embodiments of the present invention, to generate the second compression dictionary, the computer device may select parts of or all the existing data as the sample data. The size of the sample data may be larger than the size of the data previously selected for generating the first compression dictionary. The computer device may further analyze the sample data to obtain one or more common data patterns of the sample data and generate the second compression dictionary based on the one or more common data patterns.

According to embodiments of the present invention, to obtain the existing data, the computer device may obtain compressed data stored on the data target and then decompress the compressed data using the first compression dictionary.

According to embodiments of the present invention, to update the data target at the block 616, the computer device may determine a data group integrating the existing data and the one or more data blocks, compress the data group using the second compression dictionary to obtain a compressed data group, and then update the data target with the compressed data group. In some embodiment, the computer device may also remove previously stored compressed data corresponding the existing data from the data target.

According to embodiments of the present invention, if the compression performance is not lower than the preset performance threshold, the computer device may update the data target based on the one or more data blocks using the first compression dictionary.

According to embodiments of the present invention, the computer device may further determine a data change ratio of the one or more data blocks. If the data change ratio is larger than a preset change threshold, the computer device may then evaluate the compression performance of the first compression. The data change ratio may be calculated as the size of the one or more data blocks divided by the size of the existing data.

According to embodiments of the present invention, if the determined data change ratio is not larger than the preset change threshold, the computer device may update the data target based on the one or more data blocks using the first compression dictionary.

According to embodiments of the present invention, the data source may be a source table storing data, and the data target may be a target table storing data replicated from the source table. The step of detecting the one or more data blocks is implemented during a reload operation on the target table by the computer device.

According to embodiments of the present invention, the one or more data blocks are generated by one or more non-logging activities on the source table.

It should be noted that the processing of data compression according to embodiments of the present invention could be implemented by computer system/server 12 of FIG. 1.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method, comprising:
    detecting, by one or more processing units, one or more data blocks of a data source to be replicated to a data target;
    evaluating, by the one or more processing units, a compression performance of a first compression dictionary, wherein the first compression dictionary is previously used to compress existing data on the data target;
    in response to the compression performance being lower than a preset performance threshold, generating, by the one or more processing units, a second compression dictionary based on the existing data on the data target; and
    updating, by the one or more processing units, the data target based on the existing data and the one or more data blocks using the second compression dictionary.

2. The computer-implemented method of claim 1, wherein generating the second compression dictionary comprises:
    selecting, by the one or more processing units, parts of or all of the existing data as sample data, wherein a first size of the sample data is larger than a second size of data previously selected for generating the first compression dictionary;
    analyzing, by the one or more processing units, the sample data to obtain one or more common data patterns of the sample data; and
    generating, by the one or more processing units, the second compression dictionary based on the one or more common data patterns.

3. The computer-implemented method of claim 1, wherein the existing data is obtained by:
    obtaining, by the one or more processing units, compressed data stored on the data target; and
    decompressing, by the one or more processing units, the compressed data using the first compression dictionary to obtain the existing data.

4. The computer-implemented method of claim 1, wherein updating the data target based on the existing data and the one or more data blocks using the second compression dictionary further comprises:
    determining, by the one or more processing units, a data group integrating the existing data and the one or more data blocks;
    compressing, by the one or more processing units, the data group using the second compression dictionary to obtain a compressed data group; and
    updating, by the one or more processing units, the data target with the compressed data group.

5. The computer-implemented method of claim 1, further comprising:
    in response to the compression performance not being lower than the preset performance threshold, updating, by the one or more processing units, the data target based on the one or more data blocks using the first compression dictionary.

6. The computer-implemented method of claim 1, wherein the step of evaluating the compression performance of the first compression dictionary is implemented when a data change ratio of the one or more data blocks is larger than a preset change threshold, and the data change ratio is calculated as a first size of the one or more data blocks divided by a second size of the existing data.

7. The computer-implemented method of claim 6, further comprising:
    in response to the data change ratio not being larger than the preset change threshold, updating, by the one or more processing units, the data target based on the one or more data blocks using the first compression dictionary.

8. The computer-implemented method of claim 1, wherein the data source is a source table storing data, and the data target is a target table storing the data replicated from the source table, and the step of detecting the one or more data blocks is implemented during a reload operation on the data target.

9. The computer-implemented method of claim 8, wherein the one or more data blocks are generated by one or more non-logging activities on the source table.

10. A computer system, comprising:
one or more processors;
a computer-readable memory coupled to the processors, the computer-readable memory comprising instructions that when executed by the processors perform actions of:
detecting one or more data blocks of a data source to be replicated to a data target;
evaluating a compression performance of a first compression dictionary, wherein the first compression dictionary is previously used to compress existing data on the data target;
in response to the compression performance being lower than a preset performance threshold, generating a second compression dictionary based on the existing data on the data target; and
updating the data target based on the existing data and the one or more data blocks using the second compression dictionary.

11. The computer system of claim 10, wherein generating the second compression dictionary further comprises:
selecting parts of or all of the existing data as sample data, wherein a first size of the sample data is larger than a second size of data previously selected for generating the first compression dictionary;
analyzing the sample data to obtain one or more common data patterns of the sample data; and
generating the second compression dictionary based on the one or more common data patterns.

12. The computer system of claim 10, wherein the existing data is obtained by:
obtaining compressed data stored on the data target; and
decompressing the compressed data using the first compression dictionary to obtain the existing data.

13. The computer system of claim 10, wherein updating the data target based on the existing data and the one or more data blocks using the second compression dictionary further comprises:
determining a data group integrating the existing data and the one or more data blocks;
compressing the data group using the second compression dictionary to obtain a compressed data group; and
updating the data target with the compressed data group.

14. The computer system of claim 10, wherein the actions further comprise:
in response to the compression performance not being lower than the preset performance threshold, updating the data target based on the one or more data blocks using the first compression dictionary.

15. The computer system of claim 10, wherein the step of evaluating the compression performance of the first compression dictionary is implemented when a data change ratio of the one or more data blocks is larger than a preset change threshold, and the data change ratio is calculated as a first size of the one or more data blocks divided by a second size of the existing data.

16. The computer system of claim 15, wherein the actions further comprise:
in response to the data change ratio not being larger than the preset change threshold, updating the data target based on the one or more data blocks using the first compression dictionary.

17. The computer system of claim 10, wherein the data source is a source table storing data, and the data target is a target table storing the data replicated from the source table, and the step of detecting the one or more data blocks is implemented during a reload operation on the data target.

18. The computer system of claim 17, wherein the one or more data blocks are generated by one or more non-logging activities on the source table.

19. A computer program product, comprising a computer readable storage medium having program instructions embodied therewith, the program instructions executable by a processor to cause the processor to perform actions of:
detecting one or more data blocks of a data source to be replicated to a data target;
evaluating a compression performance of a first compression dictionary, wherein the first compression dictionary is previously used to compress existing data on the data target;
in response to the compression performance being lower than a preset performance threshold, generating a second compression dictionary based on the existing data on the data target; and
updating the data target based on the existing data and the one or more data blocks using the second compression dictionary.

20. The computer program product of claim 19, wherein generating the second compression dictionary further comprises:
selecting parts of or all of the existing data as sample data, wherein a first size of the sample data is larger than a second size of data previously selected for generating the first compression dictionary;
analyzing the sample data to obtain one or more common data patterns of the sample data; and
generating the second compression dictionary based on the one or more common data patterns.

* * * * *